US006693297B2

(12) United States Patent
Tsujimura et al.

(10) Patent No.: US 6,693,297 B2
(45) Date of Patent: Feb. 17, 2004

(54) THIN FILM TRANSISTOR FORMED BY AN ETCHING PROCESS WITH HIGH ANISOTROPY

(75) Inventors: Takatoshi Tsujimura, Fujisawa (JP); Masatomo Takeichi, Shiga-ken (JP); Kai R. Schleupen, Yorktown Heights, NY (US); Evan G. Colgan, Chestnut Ridge, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/884,726

(22) Filed: Jun. 18, 2001

(65) Prior Publication Data

US 2002/0190253 A1 Dec. 19, 2002

(51) Int. Cl.[7] .................. H01L 29/04; H01L 31/036; H01L 31/0376; H01L 31/20
(52) U.S. Cl. .............. 257/59; 257/61; 257/66; 257/72; 257/347
(58) Field of Search .................. 257/59, 61, 66, 257/72, 347, 774

(56) References Cited

U.S. PATENT DOCUMENTS

| 5,843,845 A | * | 12/1998 | Chung ........................ 438/640 |
| 6,067,134 A | * | 5/2000 | Akiyama et al. ........... 349/139 |
| 6,100,954 A | * | 8/2000 | Kim et al. .................. 257/410 |

* cited by examiner

Primary Examiner—Thien F Tran
(74) Attorney, Agent, or Firm—Scully, Scott, Murphy & Presser; Robert M. Trepp, Esq.

(57) ABSTRACT

The present invention discloses a thin film transistor and a process for forming thereof by a high anisotropy etching process. A thin film transistor according to the present invention comprises a transistor element including a gate electrode, a gate insulating layer, a semiconductor layer, and source and drain electrodes; a passivation layer being deposited on the layers and having first openings for contact holes; and an interlayer insulator extending along with the passivation layer and having second openings for the contact holes, the first openings and the second openings being aligned each other over the substrate, wherein an electrical conductive layer is deposited on an inner wall of the contact hole and the inner wall is formed by the first and second openings tapered smoothly and continuously through an anisotropic etching process.

14 Claims, 14 Drawing Sheets

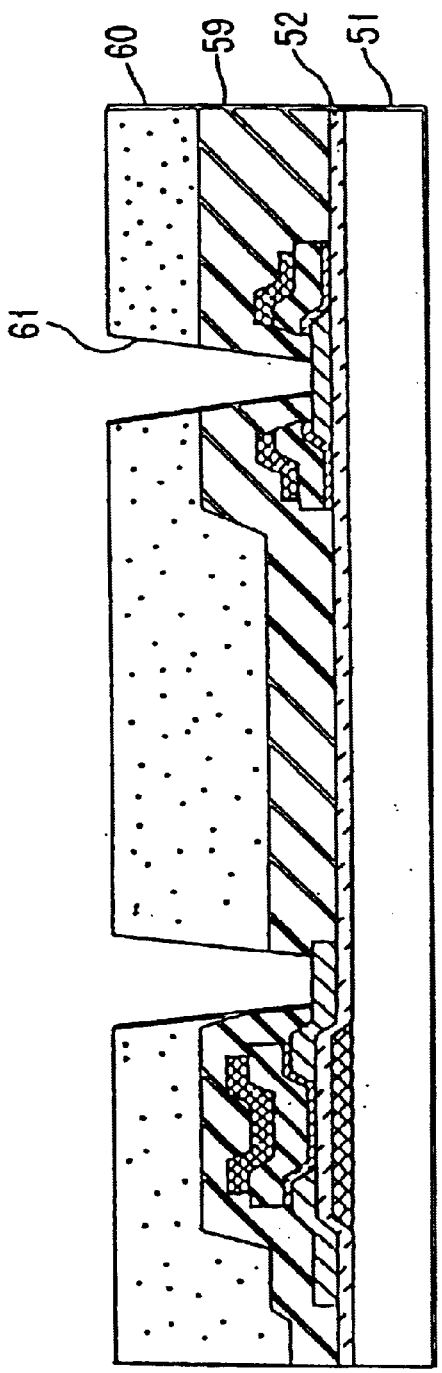
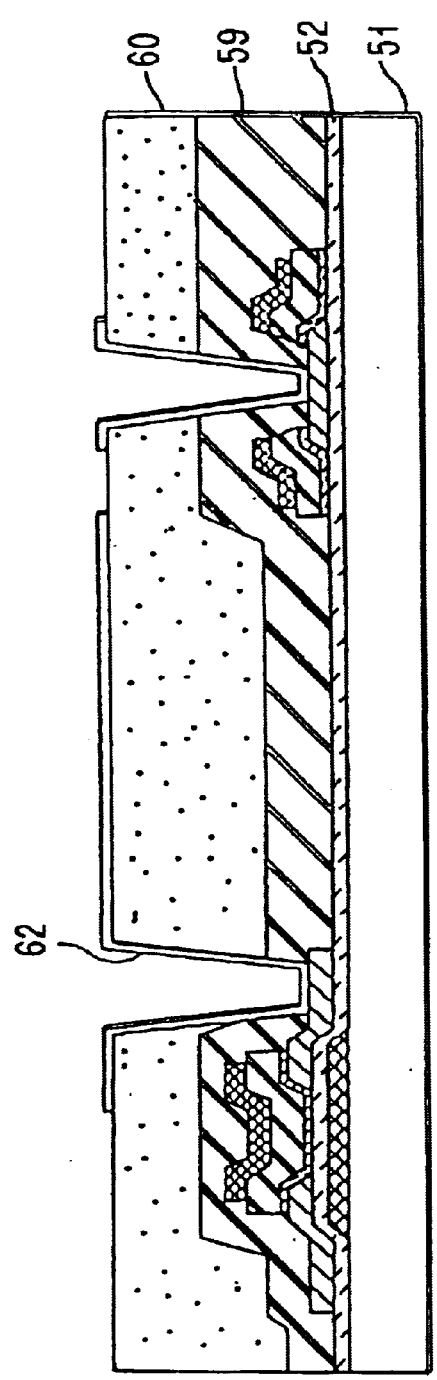
FIG.12(e)
FIG.12(f)

THIN FILM TRANSISTOR FORMED BY AN ETCHING PROCESS WITH HIGH ANISOTROPY

DESCRIPTION

FIELD OF THE INVENTION

The present invention relates to a thin film transistor (TFT), and more particularly to a method of forming a TFT by utilizing a highly anisotropic etching process. The present invention also relates to a TFT formed by the inventive method as well as a display device including the inventive TFT.

BACKGROUND OF THE INVENTION

Thin film transistors (TFTs) have been used in a wide range of semiconductor devices, such as an active matrix type liquid crystal display, an organic electro-luminescence display, and an image sensor. The reason for this is that TFTs typically provide a thin, light weight device that operates with low power consumption.

Although various thin film transistor structures for improving desired properties have been proposed so far, a thin film transistor that has a polymer film on array (PFA) structure typically improves the aperture ratio of a display device. The reason for the improved aperture ratio is that the pixel electrode made of ITO (indium tin oxide) is overlapped over a data line. In such a configuration, an electric field is not applied to a liquid crystal molecule on the ITO electrode so that the region in which disclination lines are created is limited within the region of the data line.

FIGS. 1(a)–(f) shows conventional process steps for forming the above described thin film transistor including the PFA structure. As shown in FIG. 1(a), gate electrode 2 is patterned on insulating substrate 1, which may include glass, by a suitable patterning process (1st photo engraving process; PEP). This prior art process next proceeds to the step shown in FIG. 1(b) wherein gate insulating layer 3 and semiconductor layer 4 are deposited on substrate 1 and gate electrode 2. Next, channel protection layer 5 is deposited and patterned by a suitable patterning process providing the structure shown, for example, in FIG. 1(b) (2nd PEP).

The prior art process further proceeds to a third PEP step wherein source electrode 6 and drain electrode 7 are first deposited and thereafter patterned; See FIG. 1(c). The source/drain electrodes are comprised of the same or different electrode material which is selected from the group consisting of Al, Mo, Ta, W and other like conductive metals.

Passivation layer 8 is next deposited and patterned by a fourth PEP (See FIG. 1(d)), and thereafter interlayer insulator 9 is applied on the previously patterned structure and then interlayer insulator 9 is etched to form openings 10 for contact holes as shown in FIG. 1(e) (fifth PEP). Following the fifth PEP step, an ITO layer is deposited and patterned to form pixel electrode 11 and contact holes 12 through a patterning process as shown in FIG. 1(f) (sixth PEP).

Although the above described process may form a thin film transistor (including a PFA) comprising a pixel electrode (i.e., element 11) having an improved aperture ratio, an extra patterning process, which forms the structure for contact holes 12 through the PFA, is added to the overall process, thereby significantly increasing the production cost of the TFT.

Japanese Patent Publication (Laid-Open) Heisei No.10-170951 discloses a method for forming a liquid crystal display (LCD) device that includes a step of forming contact holes in an inorganic insulating layer so that the contact holes have improved self-alignment properties. The self-alignment of the contact holes is improved by etching the inorganic insulating layer using the interlayer insulator as a resist layer. During this etching step, exposed edges of the inorganic insulating layer are often over etched and the edge of the inorganic insulating layer is recessed under the bottom edge of the interlayer insulator. This gap frequently results in point defects in the display because the pixel electrode is not electrically connected to the TFT or storage capacitor since the thin ITO layer can not bridge the gap. FIG. 2 shows a prior art display device which includes the overhang or gap therein. A gap, or overhang, is shown both at the interface of the interlayer insulator (9) and the inorganic insulating layer (8), see 13, and at the interface of the inorganic insulating layer (8) and the conductor layer which forms the drain electrode (7), see 14. To improve the continuity of the pixel electrode, the interlayer insulator is typically post-baked to obtain a smooth and continuous face between the interlayer insulator and the passivation layer. This process adds another processing step to the overall process flow which, in turn, results in a further increase in the production cost of the thin film transistor.

Japanese Patent Publication (Laid-Open) Heisei No. 10-283934 discloses a process for forming a thin film transistor. The thin film transistor disclosed in this reference is constructed by forming openings for contact holes in an interlayer insulator and then etching a passivation layer to form self-aligned edges of a contact hole in the passivation layer. Although resistance through the contact holes and pixel electrode becomes low, a gap between the interlayer insulating layer and the passivation layer exists such that defects due to the gap might be created. In addition, the disclosed process has less selectivity such that the electrodes, i.e., drain electrode, may be etched out entirely during the etching process when a display device having a large size substrate is formed.

The above conventional thin film transistors and processes for forming thereof are known in the art, the inventors have sought a novel structure which serves to reduce defects caused by the gap between the interlayer insulator and the passivation layer. The reduction in defects caused by the gap between the interlayer dielectric and passivation layer obtained in the present invention improves the performance of a display device including a TFT array while making it possible to provide a large size display device.

SUMMARY OF THE INVENTION

The present invention is directed to a novel anisotropic etching process which forms a contact hole having a smooth and continuous inner wall, thereby ensuring electrical contact between the drain electrode and the pixel electrode while reducing the number of processing steps employed in fabricating the TFT. In addition, the present invention provides a thin film transistor as well as a large sized display device that contains the inventive TFT.

Therefore, one object of the present invention is to provide a thin film transistor (TFT) having a high aperture ratio and improved reliability of electrode connection.

Another object of the present invention is to provide a thin film transistor which is capable of being used in a large area display device.

A further object of the present invention is to provide a process for forming a thin film transistor in which reliability of the electrode connection is improved.

A yet further object of the present invention is to provide a process for forming a thin film transistor which includes a reduced number of patterning steps.

An additional object of the present invention is to provide a display device including the thin film transistor of the present invention.

According to a first aspect of the present invention, a thin film transistor formed on a substrate is provided. The inventive thin film transistor comprises a transistor element including a gate electrode, a gate insulating layer, a semiconductor layer, and source and drain electrodes containing an ohmic contact layer, wherein said gate insulating layer is formed on said gate electrode and said semiconductor layer is formed on said gate insulating layer; a passivation layer having first openings for contact holes formed on said transistor element; and an interlayer insulator having second openings for the contact holes extending over said passivation layer, said first and second openings are self-aligned with each other over the substrate, and wherein an electrical conductive layer is deposited on an inner wall of the contact hole, said inner wall is formed by the first and second openings tapered smoothly and continuously by an anisotropic etching process.

Note that the above embodiment covers bottom-gate type thin film transistors. Additionally, the present invention also contemplates top-gate type thin film transistors. Specifically, the top-gate type thin film transistor comprises:

a transistor element including a gate electrode, a gate insulating layer, a semiconductor layer, and source and drain electrodes, wherein said gate insulating layer is formed on said semiconductor layer and said gate electrode is formed on said gate insulating layer;

a passivation layer having first openings for contact holes formed on said transistor element; and an interlayer insulator having second openings for the contact holes extending over said passivation layer, said first and second openings are self-aligned with each other over the substrate, and wherein an electrical conductive layer is deposited on an inner wall of the contact hole, said inner wall is formed by the first and second openings tapered smoothly and continuously by an anisotropic etching process.

According to a second aspect of the present invention, a process for forming the inventive thin film transistor on a substrate is provided. The inventive process employed in fabricating the inventive TFT comprises the steps of:

(a) providing a transistor element on a substrate that is capable of supporting a thin film transistor, said transistor element including at least a gate electrode, a gate insulating layer, a semiconductor layer and source and drain electrodes;

(b) depositing a passivation layer to cover the transistor element;

(c) forming an interlayer insulator on the passivation layer and patterning said interlayer insulator to form first openings for contact holes;

(d) patterning the passivation layer by an anisotropic etching process so as to form second openings, said anisotropic etching process having an etch selectivity for the passivation layer to drain electrode that is greater than or equal to 5:1 using an etchant gas comprising fluorine without oxygen (O);

(e) removing etching residues formed by step (d) by a dry etching process including an oxygen ($O_2$) gas; and (f) forming a pixel electrode and a contact electrode by depositing and patterning an electrical conductive layer, wherein the electrical conductive layer is deposited on an inner wall of the contact hole and the inner wall is formed by the first and second openings tapered smoothly and continuously.

According to a third aspect of the present invention, a display device (including arrayed TFTs on a substrate) having an improved aperture ratio of the pixel electrode is provided. The thin film transistor comprises a transistor element including a gate electrode, a gate insulating layer, a semiconductor layer, and source and drain electrodes containing an ohmic contact layer; a passivation layer having first openings for contact holes formed on said transistor element; and an interlayer insulator having second openings for the contact holes extending over said passivation layer, said first and second openings are self-aligned with each other over the substrate, and wherein an electrical conductive layer is deposited on an inner wall of the contact hole, said inner wall is formed by the first and second openings tapered smoothly and continuously by an anisotropic etching process.

Note that in this aspect of the present invention, the thin film transistor may be either a bottom-gate type TFT or a top-gate type TFT.

BRIEF DESCRIPTION OF DRAWINGS

FIGS. 12(a)–12(f) show another embodiment of a thin film transistor according to the present invention.

DETAILED DESCRIPTION OF THE PRESENT INVENTION

Figure 1A:
FIGS. 1(a)–1(f) show processing steps that are employed in forming the above described prior art thin film transistor including the PFA structure.
Figure 1B:
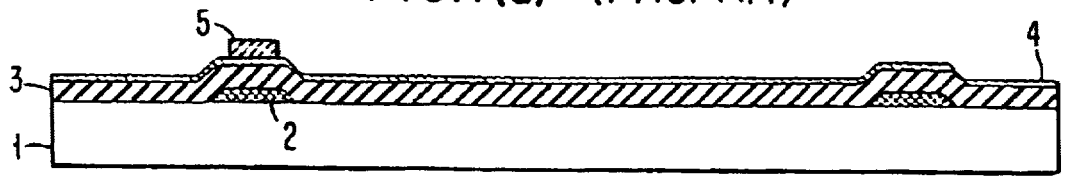
Figure 1C:
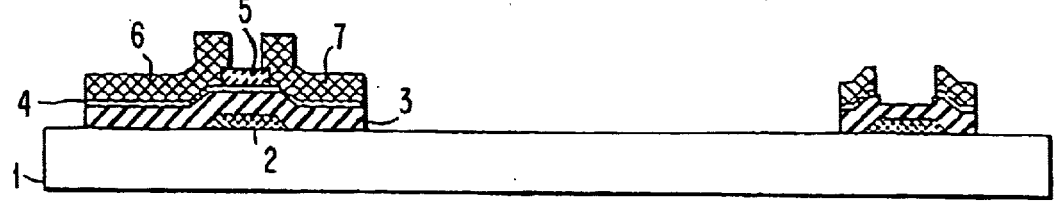
Figure 1D:
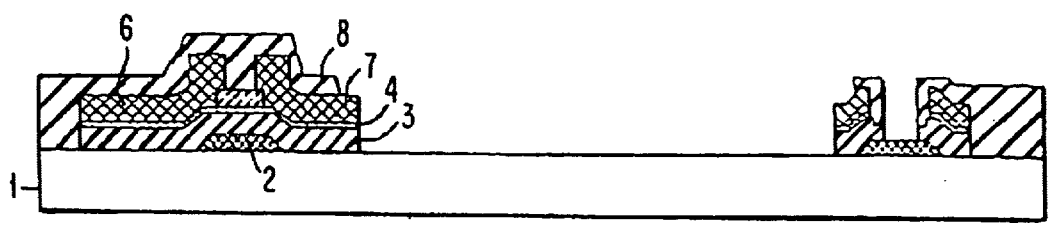
Figure 1E:
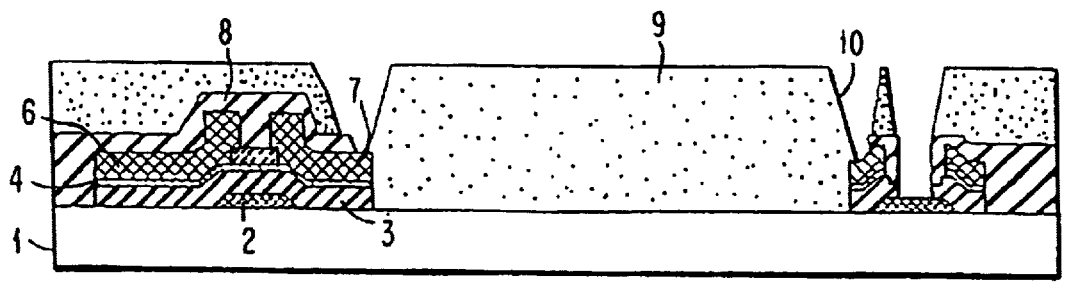
Figure 1F:
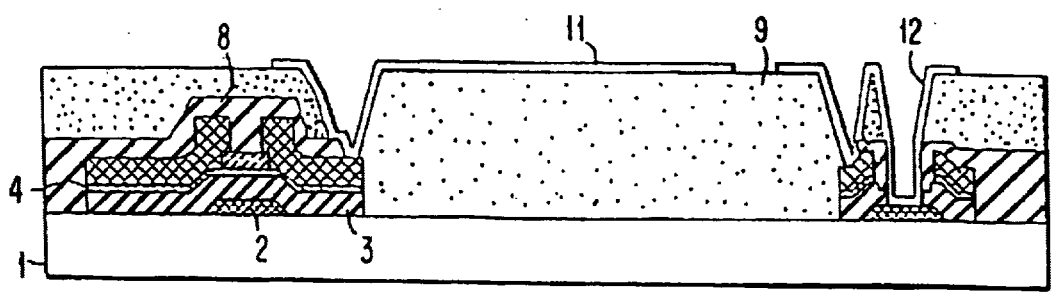
Figure 2:
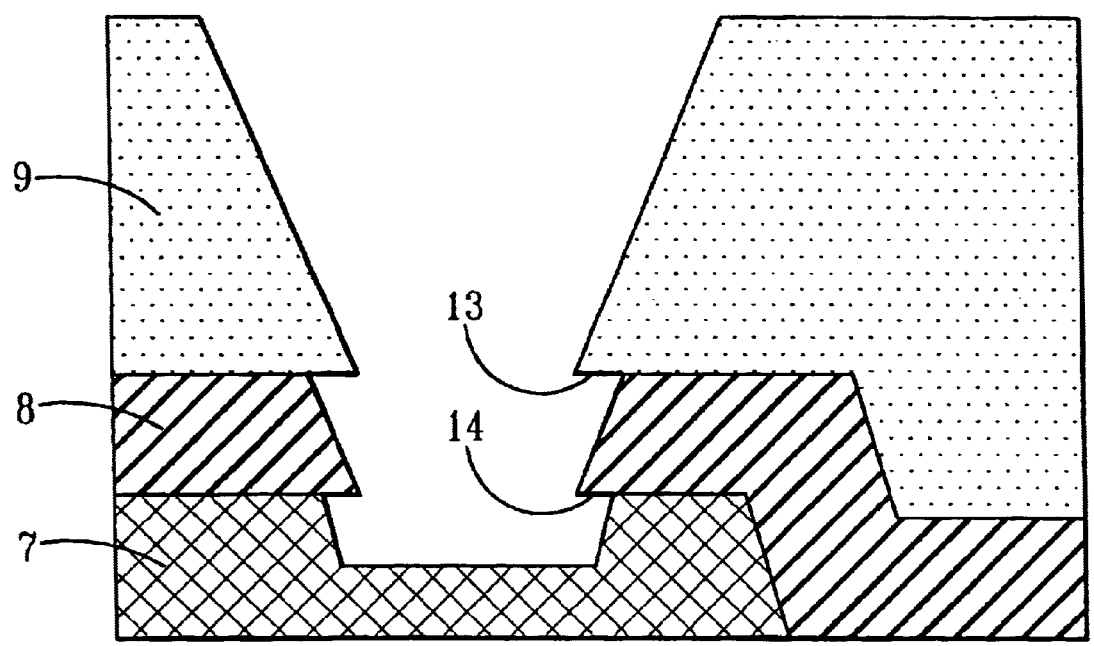
FIG. 2 shows a prior art display device including an overhang or gap therein.

The present invention which provides a novel TFT having improved device performance will now be described in greater detail by referring to the drawings that accompany the present invention.

Figure 3:
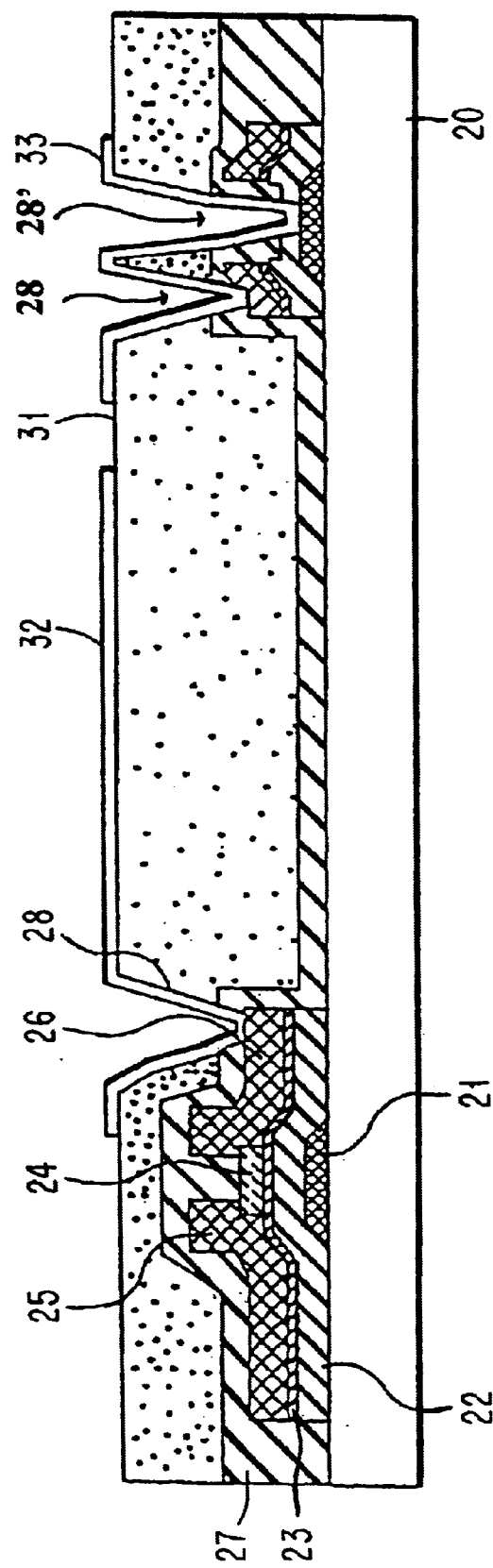
FIG. 3 shows a typical cross-sectional view of a thin film transistor according to the present invention.

Reference is first made to FIG. 3, which shows a typical cross-sectional view of a thin film transistor according to the present invention. The inventive thin film transistor is constructed by depositing layers to be defined in more detail hereinbelow on substrate 20. The substrate employed in the present invention includes conventional materials such as glass, metal oxides, ceramics, amorphous or polycrystalline silicon or other suitable materials.

Gate electrode 21 is formed on substrate 20 by a suitable deposition method such as physical vapor deposition including sputtering, vacuum evaporation or chemical vapor deposition and a subsequent patterning process. In the present invention, gate electrode 21 may be selected from the group consisting of Al, Mo, Ti, Ta, Ni and any similar conductive metal. Alloys or combinations of these conductive metals are also contemplated herein.

Gate insulating layer 22 is then deposited on substrate 20 and gate electrode 21 using a suitable deposition technique such as chemical vapor deposition (CVD), plasma-enhanced CVD, physical vapor deposition or another like deposition technique that is capable of providing an insulating layer having acceptable insulating performance. Although the thickness of the gate insulating layer may vary depending on the type of technique and material used in forming the same, the gate insulating layer typically has a physical thickness of from about 300 nm to about 500 nm. Gate insulating layer 22 may be composed of an oxide, oxynitride, or nitride including, for example, $SiN_x$, $SiO_xN_y$, or $SiO_x$. A multi-layered gate insulating layer is also contemplated in the present invention.

Semiconductor layer 23 is next deposited on gate insulating layer 22 by any suitable deposition technique such as plasma CVD. The thickness of the deposited semiconductor layer is typically less than about 300 nm, with a thickness of from about 30 nm to about 50 nm being more highly preferred. Note that semiconductor layer must be thin enough so as to provide a channel for switching the transistor between the 'on' and 'off' states.

In another embodiment of the present invention, a thin film transistor may be constructed as a top-gate type transistor. When the present invention is implemented as a top-gate type transistor, the semiconductor layer 23 may be deposited to a thickness of from about 30 nm to about 50 nm.

Semiconductor layer 23 employed in the present invention may be composed of undoped polycrystalline silicon or undoped amorphous-Si (i.e., a-Si). A suitable crystallization process for crystallizing an a-Si layer may be employed when polycrystalline silicon is used.

Channel protection layer 24 is deposited on semiconductor layer 23 in order to protect the semiconductor layer from ion injection. The channel protection layer 24 may be composed of any insulating material including, but not limited to: an oxide, nitride or oxynitride.

A ohmic contact layer (not shown) made of, for example, n+ a-Si or p+ a-Si, is typically deposited on semiconductor layer 23 and channel protection layer 24 as part of the source and drain electrodes to attain ohmic contact between semiconductor layer 23 and the source and drain electrodes.

Source and drain electrodes 25, 26, respectively, made of a metal or metal alloy are formed on the contact layer (not shown). The metal or metal alloy used in the present invention for forming the source/drain electrodes includes, but is not limited to: Al, Mo, Ti, Cr, and any alloy or combinations thereof. The electrodes are formed utilizing any conventional deposition process such as CVD, evaporation, plasma-enhanced CVD, sputtering, plating and other like deposition processes. The thickness of the electrodes is not critical to the present invention.

In the thin film transistor structure depicted in FIG. 3, passivation layer 27 is deposited to cover the underlying layers except for contact holes 28 formed at the positions corresponding to the drain electrode 26 etc. The passivation layer is composed of any inorganic or organic dielectric material known to those skilled in the art and it is formed utilizing processes that are also well known in the art.

On passivation layer 27, a polymer resin is applied to form interlayer insulator 31. In interlayer insulator 31, openings for contact holes 28 reaching to the drain electrode 26 etc. are etched by an anisotropic etching process according to the present invention such that the opening of the interlayer insulator 31 and the opening of the passivation layer 27 integrally form contact hole 28 having a smooth and continuous inner wall.

In the present invention, the polymer resin may be selected from the group consisting of a thermo-plastic type, a thermo-set type, a photo-sensitive polymer used as photoresist and mixtures thereof. As shown in FIG. 3, the openings through passivation layer 27 and interlayer insulator 31 are self-aligned together over substrate 20.

The smooth and continuous inner wall of contact hole 28 is obtained by the unique anisotropic etching process according to the present invention. Details of the etching process will be discussed later. In the present invention, the term "smooth and continuous" is defined such that the opening of interlayer insulator 31 and the opening of passivation layer 27 at their interface is continued without a gap or an undercut larger than about 50 nm, more preferably larger than about 20 nm.

In the thin film transistor described in FIG. 3, pixel electrode 32, and contact electrode 33 are formed by depositing an electric conductive material such as ITO, aluminum tin oxide (ATO), indium zirconium oxide (IZO), and $SnO_2$ and subsequently patterning the electric conductive material by a suitable patterning process. Thus, the above described thin film transistor comprises a structure having self-alignment contact holes 28 between interlayer insulator 31 and passivation layer 27. The smooth and continuous structure described above improves formation of electrically conductive layers for forming a pixel electrode etc., thereby ensuring the electric contact through contact holes 28 because of the small gap or undercut.

Figure 4:
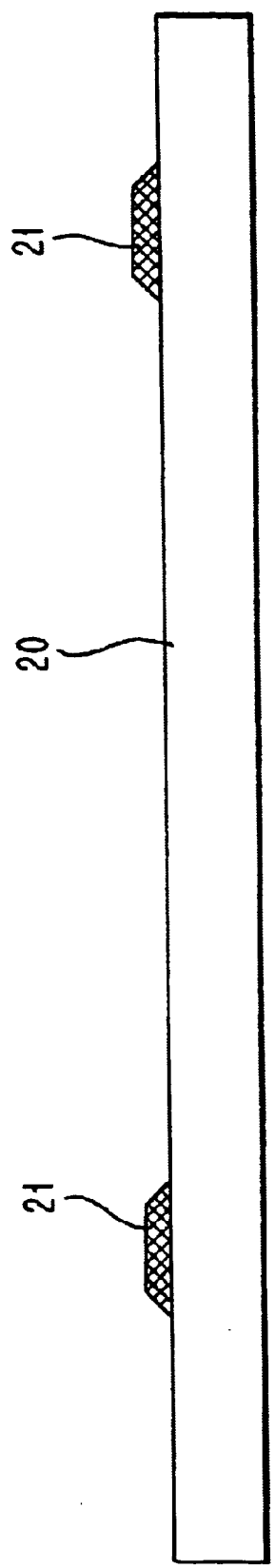
FIG. 4 shows a structure formed by a first patterning process according to the present invention.

Referring from FIG. 4 to FIG. 8, FIG. 10 and FIG. 11, a process for forming the thin film transistor according to the present invention will be discussed. FIG. 4 shows a structure formed by a first patterning process according to the present invention. As shown in FIG. 4, gate electrode 21 is deposited on substrate 20 and subsequently patterned to a desired pattern by a suitable patterning process including application of a photoresist, patterning the photoresist, etching the gate material to form gate electrode 21, and stripping the photoresist to expose gate electrode 21, i.e., a first photo engraving process (1 PEP).

Figure 5:
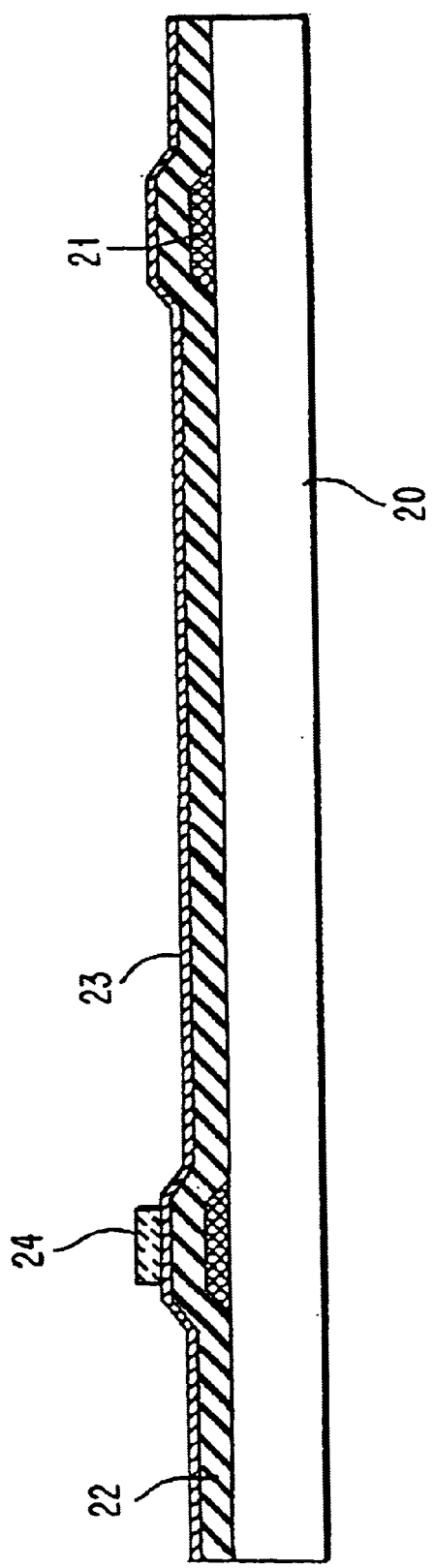
FIG. 5 shows a step of deposition of the gate insulating layer and the semiconductor layer and subsequent patterning of the channel protection layer.

The process according to the present invention proceeds to deposition of gate insulating layer 22 and semiconductor layer 23 as shown in FIG. 5. Subsequently, channel protection layer 24 is deposited on semiconductor layer 23 and patterned to a desired shape as is also shown in FIG. 5 (2nd PEP).

Figure 6:
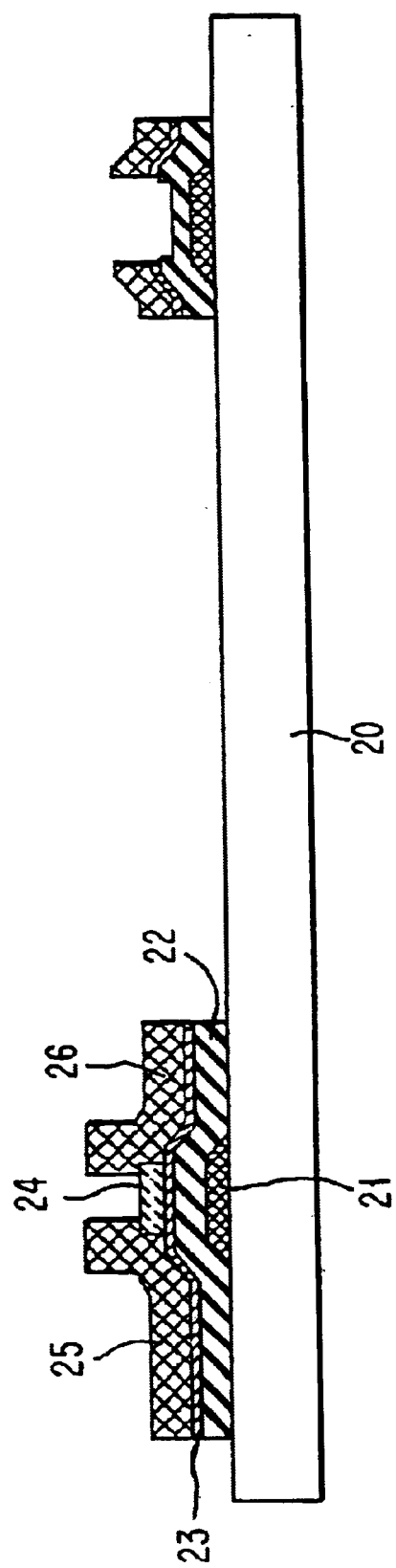
FIG. 6 shows a step of deposition and patterning of the source electrode and the drain electrode.

Next, source electrode 25 and drain electrode 26 are deposited and patterned on semiconductor layer 23 as shown in FIG. 6 (3rd PEP). A contact layer (not shown) including N+ a-Si (amorphous silicon), or P+ a-Si is formed between semiconductor layer 23 (or channel protection layer 24) and source electrode 25 (or channel protection layer 24) as well as between semiconductor layer 23 and drain electrode 26 so as to attain ohmic contact therebetween (3rd PEP).

Figure 7:
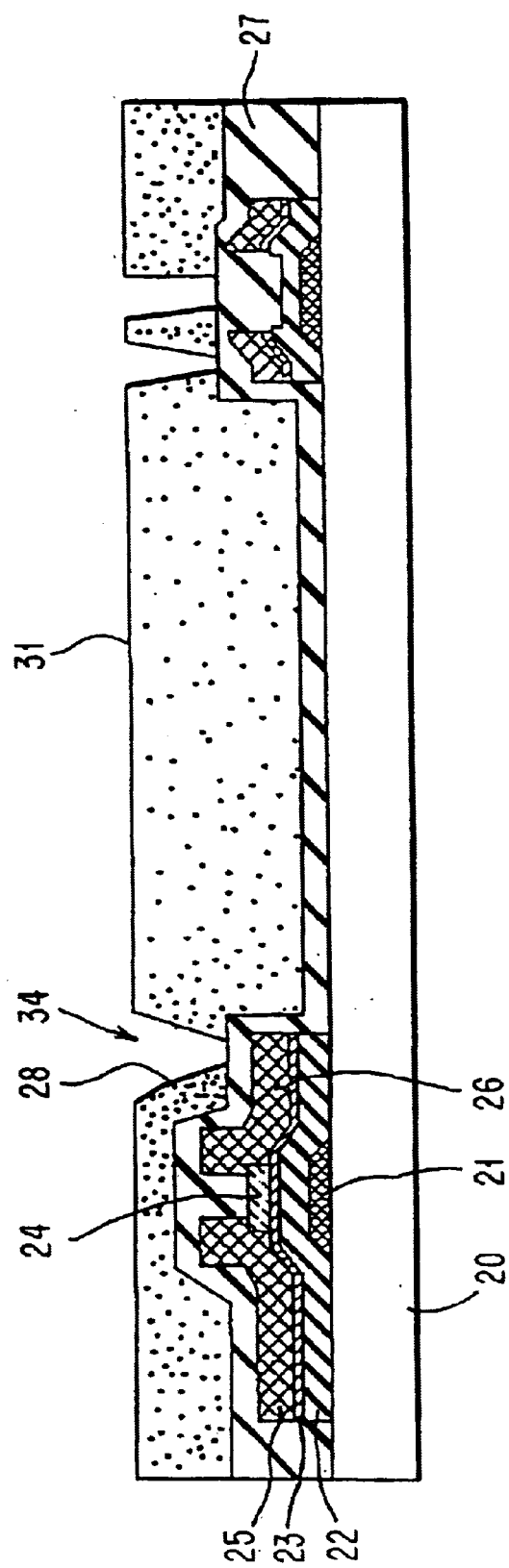
FIG. 7 shows a step of deposition and patterning of the interlayer insulating layer.

Referring to FIG. 7, passivation layer 27 is subsequently deposited over the underlying layers to a thickness of about 200 nm. Next, polymer resin is applied on passivation layer 27 and then the polymer resin is patterned by a suitable patterning process to form interlayer insulator 31 having openings 34 for contact holes 28 (4th PEP) as shown in FIG. 7. In the present invention, interlayer insulator 31 may be selected from any suitable polymer material as described above, however, when the polymer resin is a photo-sensitive polymer which has sensitivity to light, the steps to pattern the polymer resin comprise the steps of applying a photoresist on the polymer resin, patterning the polymer resin and stripping the photoresist may be omitted from the production process such that the processing steps are reduced, thereby lowering the production cost of the TFT since only an exposure and developing of the photosensitive polymer is needed.

Figure 8:
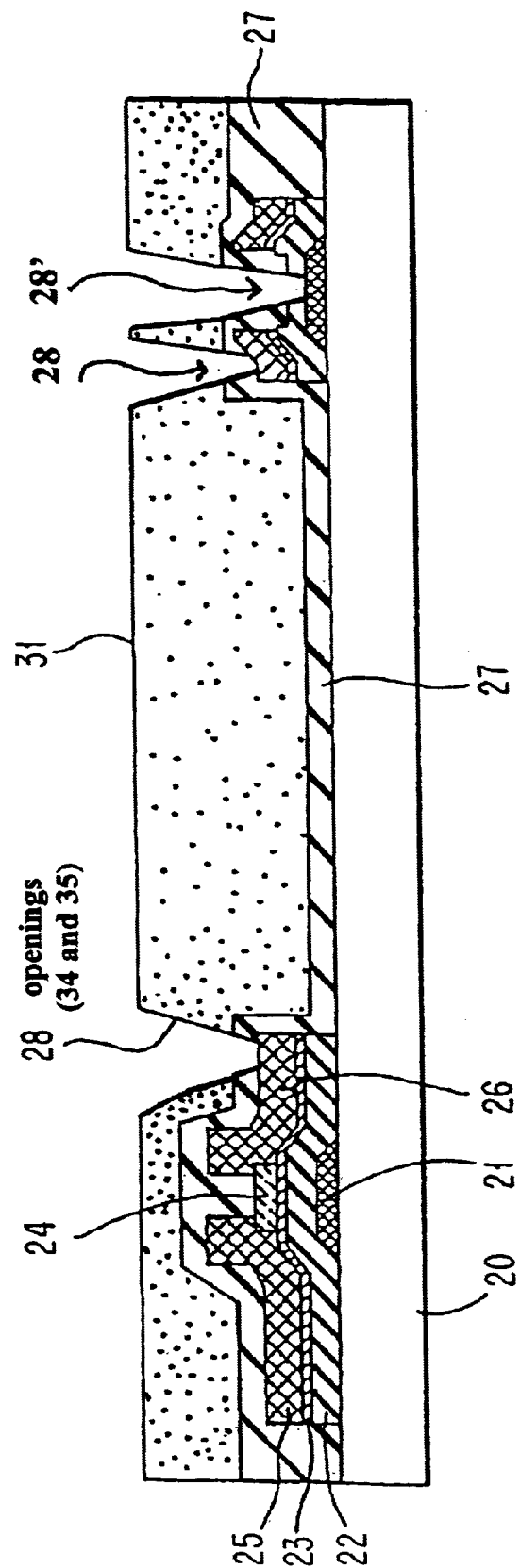
FIG. 8 shows a step of etching the interlayer insulator, the passivation layer and gate insulator simultaneously to form the contact hole.

Next, the process proceeds to an etching process such as shown in FIG. 8, and interlayer insulator 31, passivation layer 27 and gate insulator 22 are etched out simultaneously to form contact holes 28. Note that the openings in the interlayer layer 31 in FIG. 8 are larger than in FIG. 7 due to the simultaneous etching of layer 31 along with layers 27 and 22 (where there is an opening to the gate metal). The etching process described above is characterized by high anisotropy using an Induced Coupling Plasma (ICP) etching process. In the etching process of passivation layer 27, several critical features are required so as to obtain the smooth and continuous inner wall inside contact hole 28 using interlayer insulator 31 as a mask. Those are summarized as follows:

(1) The etching should not cause etch-back of passivation layer 27 below interlayer insulator 31, and therefore a high anisotropic etching process is required.
(2) The etching should not damage interlayer insulator 31.

The inventors have found that the Inductively Coupled Plasma (ICP) etching of the layers using a particular etchant satisfies the above described requirements together with other requirements of the thin film transistor rather than other conventional etching processes such as CDE (Chemical Dry Etching), PE (Plasma Etching), or RIE (Reactive Ion Etching); CDE and PE may provide isotropic etching (hence anisotropic etching can not be achieved from these processes) and RIE requires high power to obtain anisotropic etching which may cause damage to interlayer insulator 31.

Figure 9:
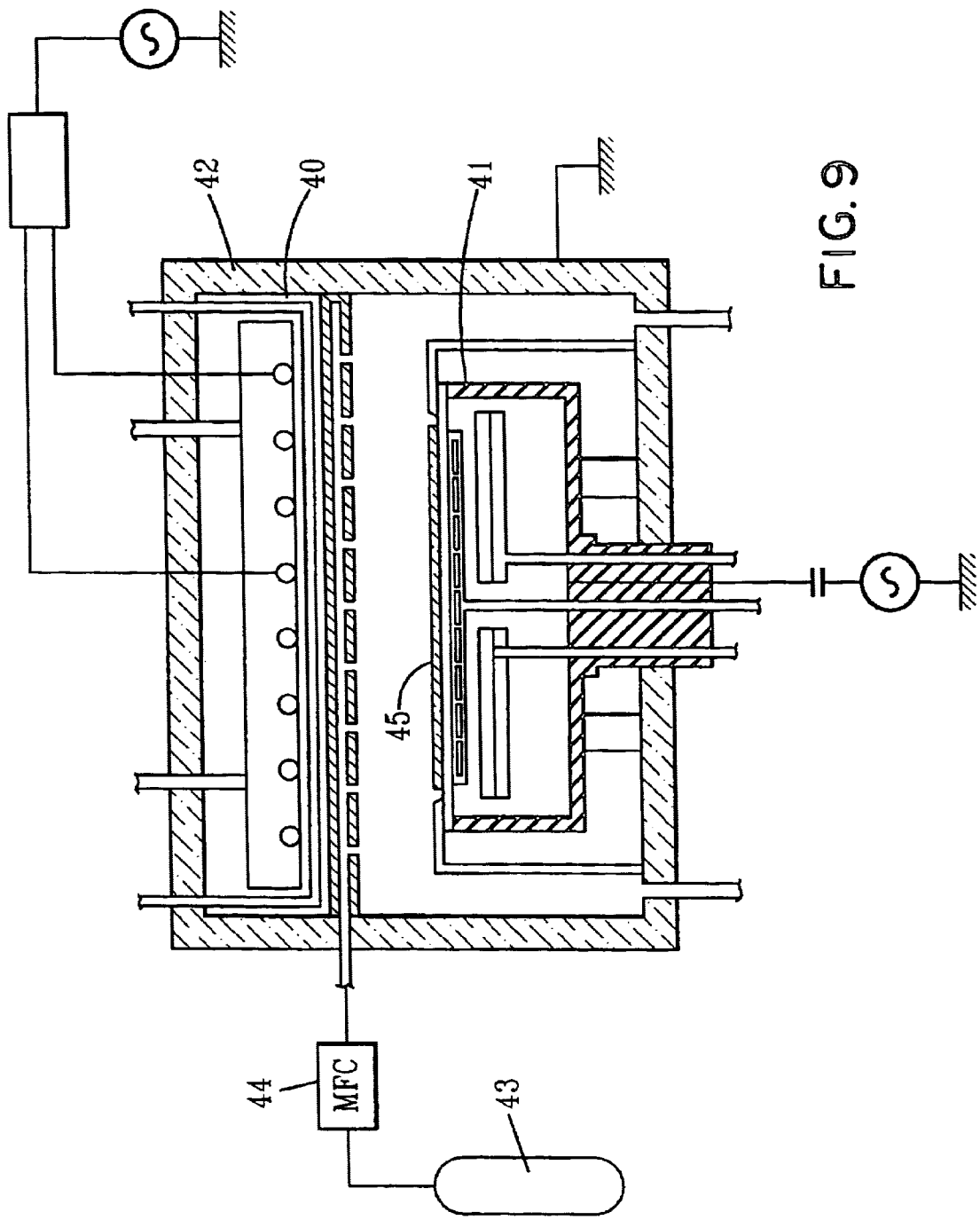
FIG. 9 shows an apparatus for ICP etching used in the present invention.

The ICP etching according to the present invention may be carried out using an ICP apparatus described in FIG. 9. Referring to FIG. 9, the IPC apparatus employed in the present invention generally comprises two RF sources 40, 41 which are both disposed in vacuum chamber 42. The first RF source 40 is disposed in the upper section of vacuum chamber 42 and generates etching species in a plasma created by a RF discharge of a dry etchant introduced from cylinder 43 through mass flow controller (MFC) 44. The second RF source 41 is disposed in the lower section of vacuum chamber 42 and accelerates the etching species toward substrate 45 to which the layers have been already deposited thereon.

In the present invention, a dry etchant including, for example, $SF_6$, $CF_4$, $CH_2F_2$, $CHF_3$, $CF_3CF_3$, $CH_3CF_3$ or any mixture thereof, can be employed so long as the elements C (carbon) and F (fluorine) may be created in the plasma and fluorinated carbon compounds with metal, which is used to form drain electrode 26 etc. such as, for example $MC_xF_y$, may be created on the surface of the drain electrode during the etching process, wherein "M" denotes a metal element and x and y are positive integers. The metal element M may include Mo (Molybdenum), Ta (Tantalum), W (tungsten), Al (aluminum), and any alloy or combinations thereof. However, the dry etchant should not generate oxygen (O) so as to obtain the high anisotropic etching according to the present invention. The inventors have found that $MC_xF_y$ species have high performances to stop the ICP etching particularly at low etchant gas pressure without including oxygen (O) which prevents attack of the metal lines.

The dry etchant may be introduced in the vacuum chamber at a low pressure (on the order of from about 1 to about 100 Pa) so as to obtain sufficient anisotropy without damaging the polymer resin which is included in interlayer insulator 31.

The above etching conditions provide high etching selectivity, and typical selectivity that is larger than about 5:1, and preferably from about 10:1 to about 15:1, for the passivation layer ($SiN_x$):metal. The selectivity for the interlayer insulator to the passivation layer is from about 2:1 to about 5:1. In accordance with the present invention, the preferred selectivity for interlayer insulator:passivation layer:metal may range from about 20:10:1 to about 50:10:1. In the present invention, the selectivity may be represented by, for example, etched thickness (nm) per min, i.e., nm/min. Typically the polymer resin is etched with a rate of about 1000 nm/min, therefore the present invention can provide an etching rate of the metal of about 50 nm/min or of about 20 nm/min or less, and hence the undercut of passivation layer 27 is improved significantly. In another embodiment of the present invention, a metal layer such as Mo, Ta, W, MoW etc. may be deposited on source and drain electrodes 25, 26 so as to further improve the selectivity.

Figure 10:
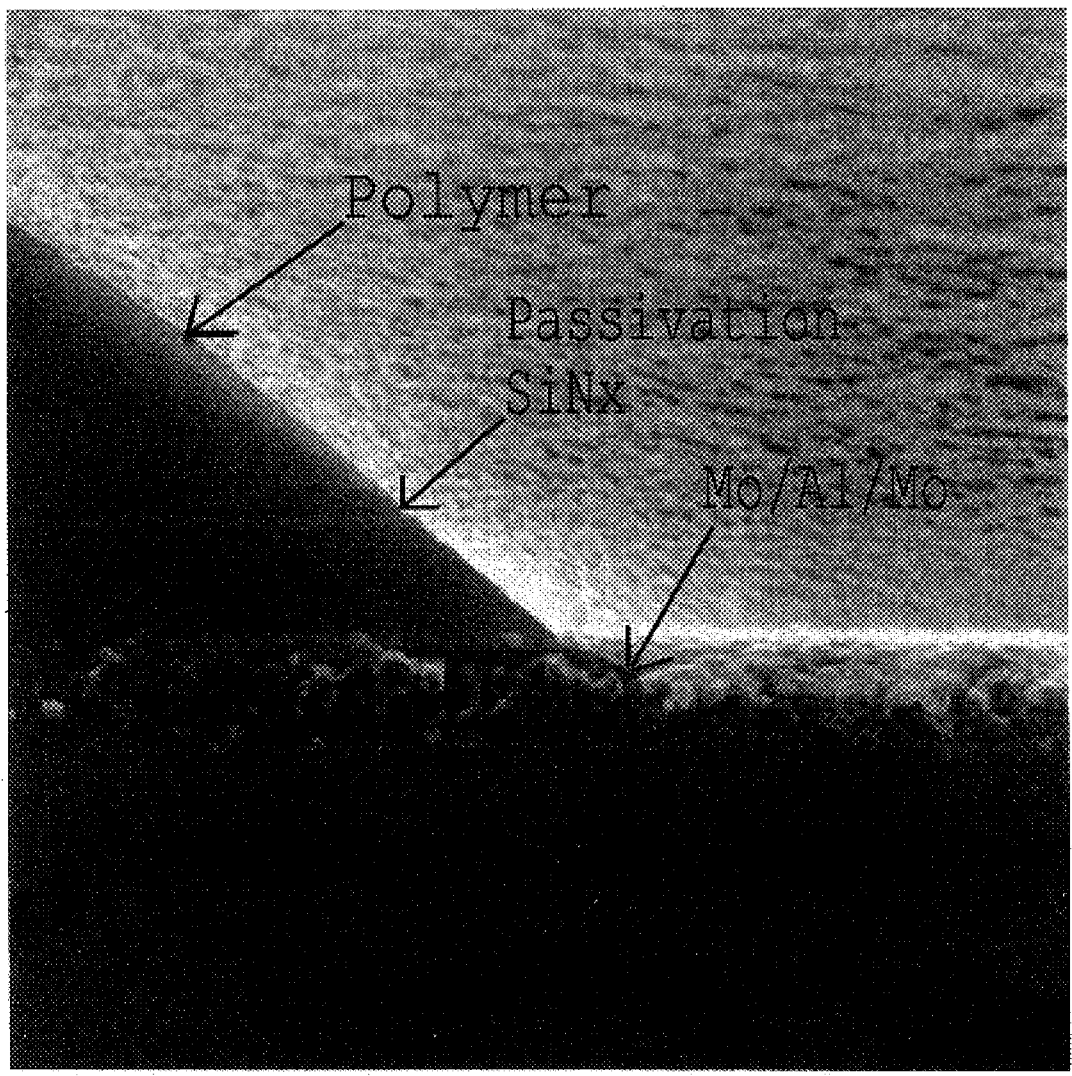
FIG. 10 shows a microphotograph of the inside wall of contact hole 28 according to the present invention.

FIG. 10 shows a microphotograph of the inside wall of contact hole 28 according to the present invention. In the embodiment shown in FIG. 10, drain electrode 26 includes a combination of a Mo/Al alloy top layer overlaying a Mo bottom layer, wherein the top Mo layer on drain electrode 26 improves the selectivity. As shown in FIG. 10, polymeric interlayer insulator 31 and passivation layer 27 form a smooth and continuous face without any gap or undercut of the passivation layer. Since the undercut is not formed due to the high selectivity obtained in the present invention, the thin electrode (having a thickness on the order of about 50 nm) made of transparent conductive material such as ITO etc. is deposited without any discontinuity of the electrode at the gap or the undercut portion.

Figure 11:
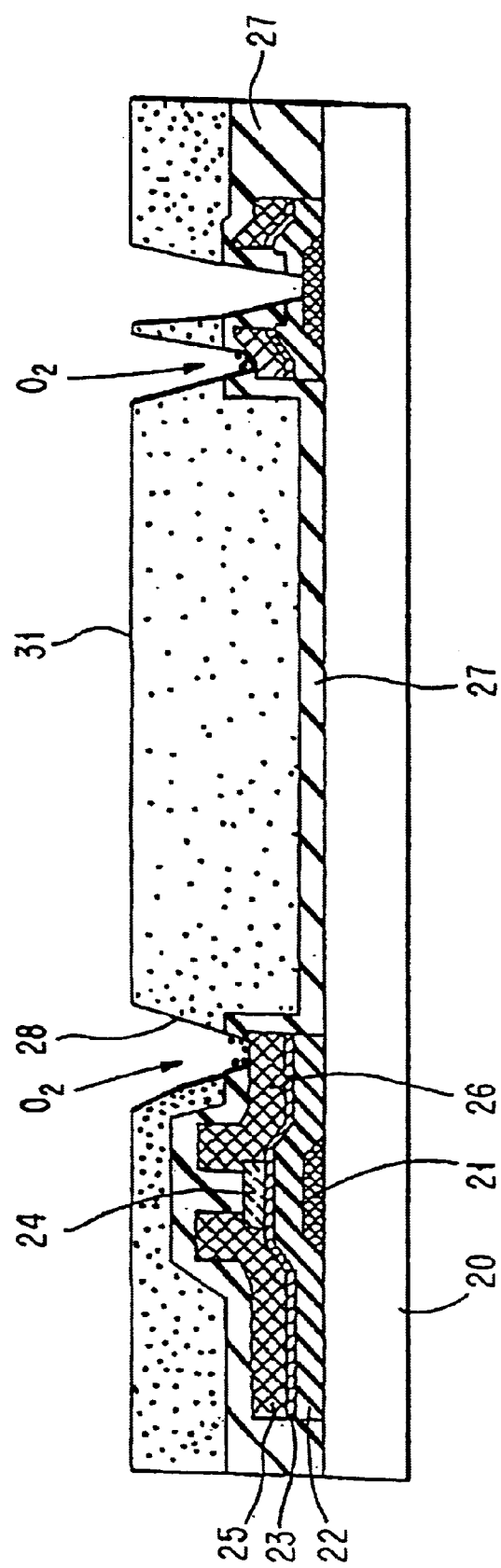
FIG. 11 shows a cleaning, step according to the present invention.

Referring to FIG. 11, the process next proceeds to a cleaning -step to remove etching residues such as $MC_xF_y$ to ensure good electrical connection of drain electrode 26 and pixel electrode 32. Although $MC_xF_y$ improves the selectivity of the etching, $MC_xF_y$ sometimes increased contact resistance and lowers adhesion between drain electrode 26 and pixel electrode 32. The cleaning step of the present invention is thus carried out using oxygen ($O_2$) as a dry etchant for a short time and at a high bias voltage for acceleration prior to the deposition of the transparent electrodes. The cleaning step may be also carried out by the ICP method described above, however, any other etching process may be used in the present invention as far as the cleaning step does not degrade interlayer insulator 31.

The process next proceeds to a step of depositing and forming pixel electrode 32 and contact electrode 33. Electrodes 32, 33 may be selected from transparent conductive materials such as ITO, ATO, IZO, and $SnO_2$ etc., and the electrodes may be deposited and patterned by any suitable deposition method and etching method.

FIG. 12 shows another embodiment of the process for forming the thin film transistor according to the present invention. The thin film transistor shown in these figures is a top-gate type transistor and the interlayer insulator covers the transistor element including a gate electrode, a gate insulating layer and source and drain electrodes. In the process described in FIG. 12(a), light shielding layer 50 is first deposited on substrate 51 and patterned to a desired pattern. Next, insulating layer 52 is deposited to cover substrate 51 and light shielding layer 50 and subsequently source electrode 53, drain electrode 54 and signal line 55 are deposited and patterned as is shown in FIG. 12(b).

Figure 12A:
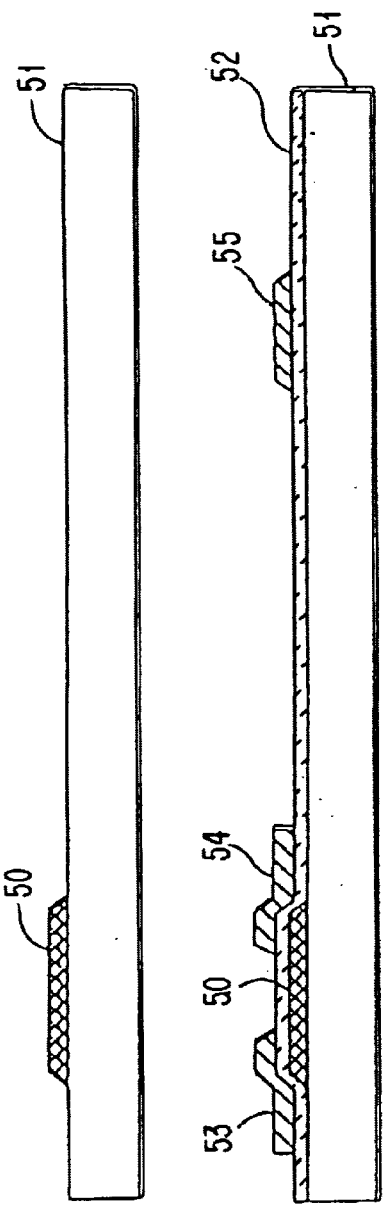
Figure 12B:
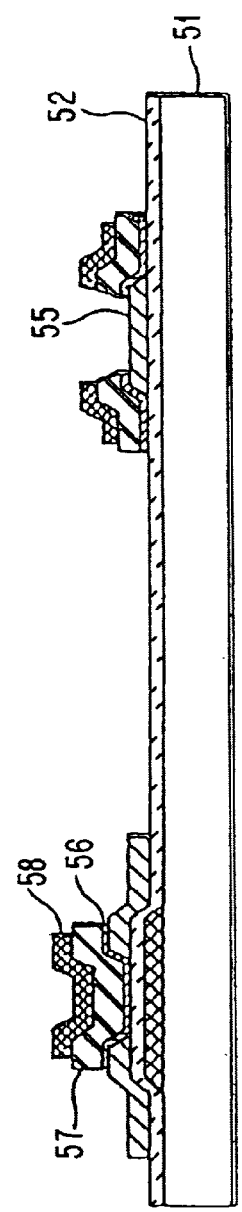
Figure 12C:
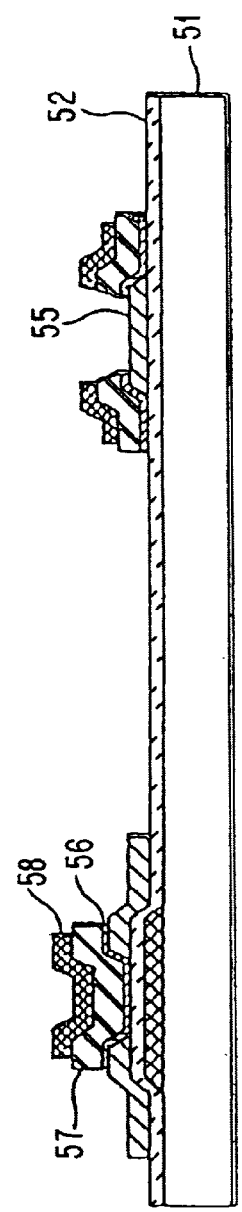
Figure 12D:
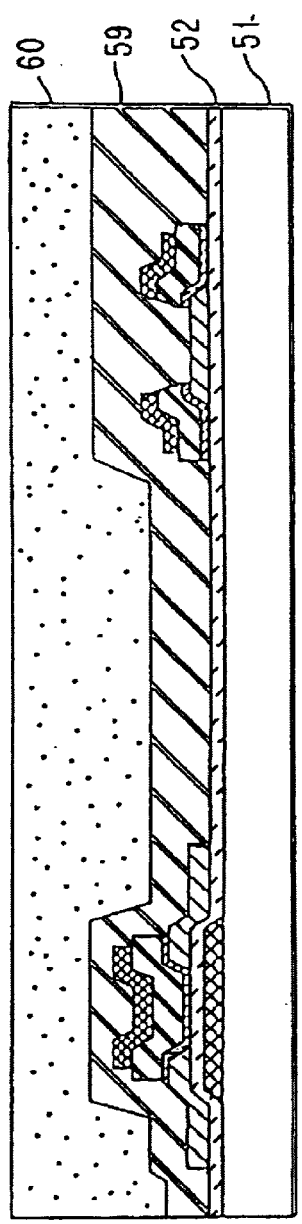

In the process shown in FIG. 12(c), semiconductor layer 56, gate insulation layer 57, and gate electrode 58 are deposited and patterned to form the thin film transistor structure. Next, passivation layer 59 and interlayer insulator 60 are provided on the transistor element as shown in FIG. 12(d). Note that ohmic contacts (not shown in the drawings) are typically formed on layers 53 and 54.

Subsequently, the anisotropic etching process according to the present invention is performed on interlayer insulator 60 and passivation layer 59 to form contact holes 61 having self-aligned inner walls such as shown in FIG. 12(e). In the described embodiment, it may be preferred to use Mo-containing source and drain electrodes to ensure high selectivity to the electrodes. It may be also possible to form a Mo-containing layer or Mo-containing film on source and drain electrodes 53, 54 to obtain etching with high anisotropy. A Mo-containing electrode may also be used on layer 55.

Thereafter, the cleaning process as described above is applied as described in FIG. 11 and an ITO layer is deposited and patterned to form pixel electrode 62 as shown in FIG. 12(f).

Figure 13:
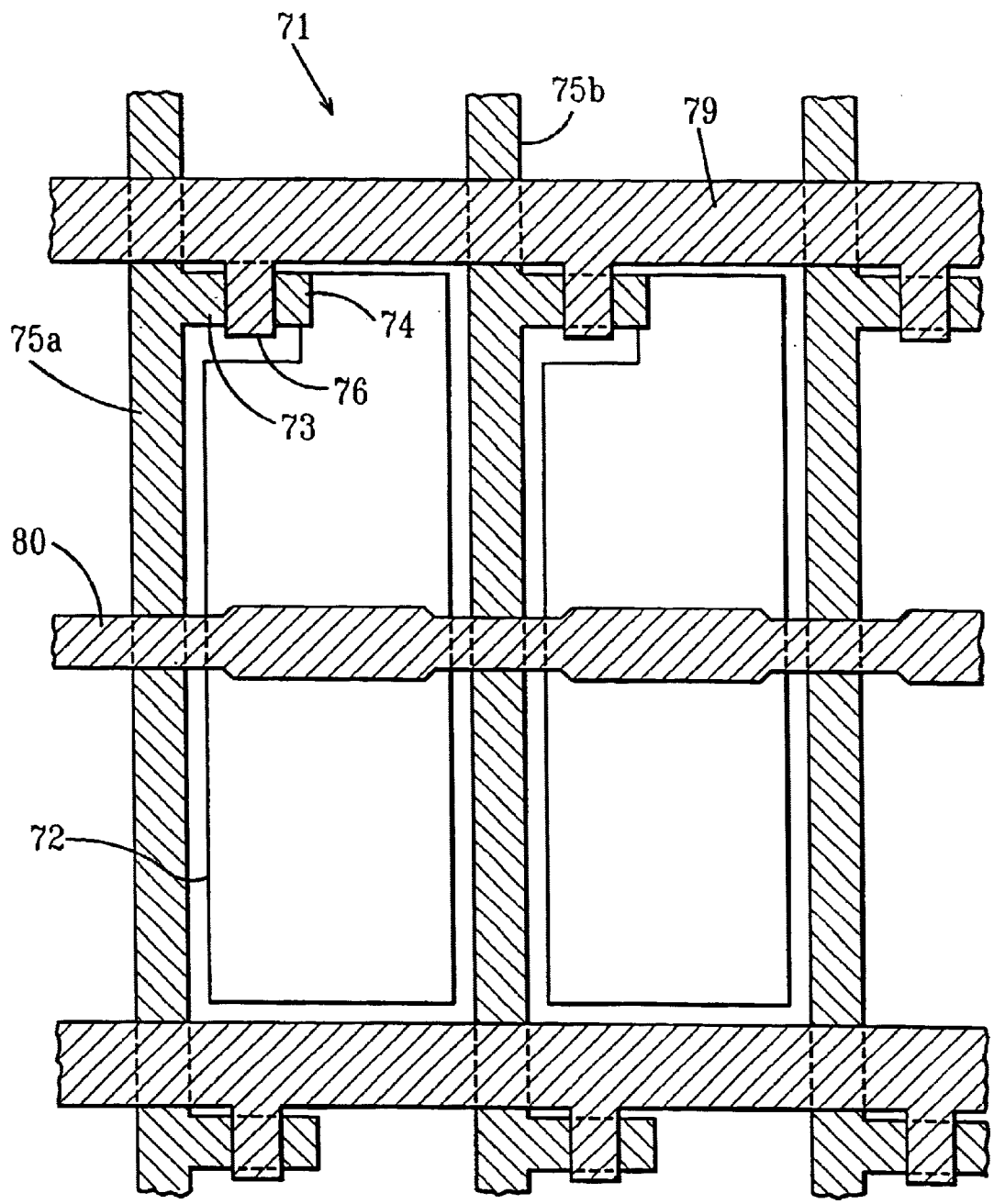
FIG. 13 shows a plane view of a display device including a TFT array according to the present invention.

FIG. 13 shows a plane view of a typical thin film transistor array used for a liquid crystal display where the thin film transistors are formed according to the present invention. The thin film transistors shown in FIG. 13 are bottom-gate type thin film transistors. In FIG. 13, the thin film transistors according to the present invention are arrayed to provide thin film transistor array substrate 71 and a plurality of pixel electrodes 72 are disposed on substrate 71. The pixel electrodes may be formed from any suitable material depending on a particular application. For example, when the semiconductor device is used as an active matrix type liquid crystal display device, pixel electrodes 72 may be composed of a transparent electrically conductive material such as ITO, IZO, ATO, or $SnO_2$.

Source electrode 74 is connected to pixel electrode 72, and drain electrode 73 is connected to signal line 75a. Gate electrode 76 is formed on source and drain electrodes 74, 73, respectively, and is connected to gate line 79. In the described embodiment in FIG. 12, capacitance ground line 80 is formed to control the capacitance of the substrate.

Although the present invention has been explained using specific embodiments for a liquid crystal display device, the thin film transistor according to the present invention may be used as a TFT array of an electro-luminescence display device as well.

Herein above, the present invention has been explained by using specific embodiments depicted in the drawings, however, a person skilled in the art may appreciate that various omissions, modifications, and other embodiments may be possible according to teachings of the present description without departing from the scope of the present invention. It is therefore intended that the present invention not be limited to the exact forms and details described and illustrated, but fall within the spirit and scope of the appended claims.

Having thus described our invention in detail, what we claim as new and desire to secure by the Letters Patent is:

1. A thin film transistor structure formed on a substrate comprising:
    a plurality of transistor elements each including a gate electrod; a gate insulating layer, a semiconductor layer, and source and drain electrodes;
    a passivation layer having lower openings for contact holes located on each of said transistor elements;
    an interlayer insulator layer having upper openings for the contact holes extending over said passivation layer, each of said upper and lower openings are self-aligned with each other over the substrate;
    an electrical conductive layer located on inner walls of each of the contact holes, said inner walls are formed by upper and lower openings tapered smoothly and continuously by an anisotropic etching process, and wherein at least one contact hole extends through the interlayer insulator layer and the passivatian layer to contact either the source or drain electrode and at least another contact hole extends through the interlayer insulator layer, the passivation layer and the gate insulating layer to contact the gate electrode.

2. The thin film transistor structure of claim 1, wherein said upper openings and said lower openings are tapered without a gap larger than or equal to about 50 nm.

3. The thin film transistor structure of claim 1, wherein said interlayer insulator lover is a thermo-plastic resin, a thermo-set resin, a photo-sensitive polymer, or a mixture thereof.

4. The thin film transistor structure of claim 1, wherein said source and drain electrodes comprise a metal selected from the group consisting of Mo, Ta, W, Al and alloys or combinations thereof.

5. The thin film transistor structure of claim 1, wherein said gate electrode has a top layer comprised of Mo or a Mo-containing alloy.

6. The thin film transistor structure of claim 1, wherein said gate insulating layer is formed on said gate electrode and said semiconductor layer is formed on said gate insulating layer.

7. The thin film transistor structure of claim 1, wherein said gate insulating layer is formed on said semiconductor layer and said gate electrode is formed on said gate insulating layer.

8. A display device with an improved aperture ratio of a pixel, said display device comprising:
    a plurality of transistor elements each including a gate electrode, a gate insulating layer, a semiconductor layer, and source and drain electrodes;
    a passivation layer having lower openings for contact holes located on each of said transistor elements;
    an interlayer insulator layer having upper openings for the contact holes extending over said passivation layer, each of said upper and lower openings are self-aligned with each other over the substrate;
    an electrical conductive layer located on inner walls of each of the contact holes, said inner walls are formed by upper and lower openings tapered smoothly and continuously by an anisotropic etching process, and wherein at least one contact hole extends through the interlayer insulator layer and the passivation layer to contact either the source or drain electrode and at least another contact hole extends through the interlayer insulator layer, the passivation layer and the gate insulating layer to contact the gate electrode.

9. The tin film transistor of claim 8, wherein said upper openings and said lower openings are tapered without a gap larger than or equal to about 50 nm.

10. The display device of claim 8, wherein said interlayer insulator layer is a thermoplastic resin, a photo-sensitive polymer, or a mixture thereof.

11. The display device of claim 8, wherein a metal layer selected from the group consisting of Mo, Ta, W, Al and an alloys or combinations thereof is deposited on said source and said drain electrodes.

12. The display device of claim 8, wherein said display device is a liquid crystal display device or an electroluminescence display device.

13. The display device of claim 8, wherein said gate insulating layer is formed on said gate electrode and said semiconductor layer is formed on said gate insulating layer.

14. The display device of claim 8, wherein said gate insulating layer is formed on said semiconductor layer and said gate electrode is formed on said gate insulating layer.

* * * * *

UNITED STATES PATENT AND TRADEMARK OFFICE
CERTIFICATE OF CORRECTION

PATENT NO. : 6,693,297 B2
DATED : February 17, 2004
INVENTOR(S) : Takatoshi Tsujimura et al.

It is certified that error appears in the above-identified patent and that said Letters Patent is hereby corrected as shown below:

Column 6,
Line 11, after "31" insert -- (i.e., upper opening 34; sometimes referred to herein as the second opening) --
Line 12, after "27" insert -- (i.e., lower opening 35; sometimes referred to herein as the first opening --
Line 13, after "wall." insert -- Note that the terms 'first opening and second opening' are related to the position of the openings formed relative to the substrate. Also, note that one of contact holes (labeled as 28") extends through interlayer 31, passivation layer 27 and gate insulating layer 22. --

Column 7,
Line 5, after "having" insert -- upper --
Lines 19-21, delete "interlayer insulator 31, passivation layer 27 and gate insulator 22 are etched out simultaneously to form contact holes 28. Note that the openings" and insert -- passivation layer 27 alone and a combination passivation layer 27 and gate insulator 22 are etched out simultaneously to form contact holes 28 and 28', respectively. This etching step forms lower openings 35 in the structure. Note that the upper openings --
Line 29, after "28" insert -- and 28; --

Column 10,
Line 31, "lover" should read -- layer --

Column 11,
Line 3, "tin" should read -- thin --

Signed and Sealed this

Fourth Day of January, 2005

JON W. DUDAS
*Director of the United States Patent and Trademark Office*